US011770286B2

(12) United States Patent
Timo et al.

(10) Patent No.: US 11,770,286 B2
(45) Date of Patent: Sep. 26, 2023

(54) SIGNAL DIMENSION REDUCTION USING A NON-LINEAR TRANSFORMATION

(71) Applicant: Telefonaktiebolaget LM Ericsson (publ), Stockholm (SE)

(72) Inventors: Roy Timo, Kungsängen (SE); Miguel Berg, Sollentuna (SE); Niklas Wernersson, Kungsängen (SE); Zhao Wang, Täby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 17/753,737

(22) PCT Filed: Sep. 13, 2019

(86) PCT No.: PCT/SE2019/050867
§ 371 (c)(1),
(2) Date: Mar. 11, 2022

(87) PCT Pub. No.: WO2021/049986
PCT Pub. Date: Mar. 18, 2021

(65) Prior Publication Data
US 2022/0368583 A1 Nov. 17, 2022

(51) Int. Cl.
*H04L 27/26* (2006.01)
*H04B 7/08* (2006.01)
*H04L 25/02* (2006.01)

(52) U.S. Cl.
CPC ......... *H04L 27/2647* (2013.01); *H04B 7/086* (2013.01); *H04L 25/0254* (2013.01)

(58) Field of Classification Search
CPC .. H04L 27/2647; H04L 25/0254; H04B 7/086
See application file for complete search history.

(56) References Cited

U.S. PATENT DOCUMENTS

2017/0141888 A1\* 5/2017 Liu .................. H04L 27/26035
2017/0373890 A1\* 12/2017 Fertonani ............. H04W 72/21
(Continued)

FOREIGN PATENT DOCUMENTS

WO      2019171141 A2      9/2019

OTHER PUBLICATIONS

International Search Report and Written Opinion for Application No. PCT/SE2019/050867, dated Jun. 2, 2020, 12 pages.
(Continued)

*Primary Examiner* — Janice N Tieu
(74) *Attorney, Agent, or Firm* — Nicholson De Vos Webster & Elliott LLP

(57) ABSTRACT

A method performed by a radio unit for handling a number of received radio signals over an array of antennas comprised in the radio unit. The radio unit transforms the number of received radio signals into a number of sequences of complex symbols. The radio unit further filters the number of sequences of complex symbols by inputting the number of sequences of complex symbols into a trained computational model comprising an alternating sequence of linear and nonlinear functions and thereby obtaining a reduced number of sequences. The radio unit further transmits the reduced number of sequences to a baseband unit over a front-haul link.

18 Claims, 12 Drawing Sheets

(56) References Cited

U.S. PATENT DOCUMENTS

2018/0287696 A1* 10/2018 Barbieri ............... H04W 36/08
2020/0052941 A1* 2/2020 Lang .................... G01S 7/0234

OTHER PUBLICATIONS

Chao-Kai et al., "Deep Learning for Massive MIMO CSI Feedback," Apr. 23, 2018, pp. 1-5.
Ting Wang et al., "Spatial Compression for Fronthaul-Constrained Uplink Receiver in 5G Systems," 2019, 6 pages, 2019 IEEE Wireless Communications and Networking Conference (WCNC).
Ericsson AB et al., "Common Public Radio Interface: eCPRI Interface Specification," Jun. 25, 2018, 62 pages, eCPRI Specification V1.2.

* cited by examiner

SIGNAL DIMENSION REDUCTION USING A NON-LINEAR TRANSFORMATION

CROSS-REFERENCE TO RELATED APPLICATIONS

This application is a National stage of International Application No. PCT/SE2019/050867, filed Sep. 13, 2019, which is hereby incorporated by reference.

TECHNICAL FIELD

Embodiments herein relate to a radio unit, a baseband unit and method performed therein. In particular, embodiments herein relate to handling multiple radio signals in a wireless communication network.

BACKGROUND

In a typical wireless communication network, user equipments (UE), also known as wireless communication devices, mobile stations, stations (STA) and/or wireless devices, communicate via a Radio Access Network (RAN) to one or more core networks belonging to different network operators. The RAN covers a geographical area which is divided into areas or cell areas, with each area or cell area being served by a radio network node e.g., a Wi-Fi access point or a radio base station (RBS), which in some networks may also be called, for example, a NodeB, eNodeB or a gNodeB. The area or cell area is a geographical area where radio coverage is provided by the radio network node. The radio network node communicates over an air interface operating on radio frequencies with the UE within range of the radio network node.

A Universal Mobile Telecommunications System (UMTS) is a third generation telecommunication network, which evolved from the second generation (2G) Global System for Mobile Communications (GSM). The UMTS terrestrial radio access network (UTRAN) is essentially a RAN using wideband code division multiple access (WCDMA) and/or High Speed Packet Access (HSPA) for user equipment. In a forum known as the Third Generation Partnership Project (3GPP), telecommunications suppliers propose and agree upon standards for third generation networks and UTRAN specifically, and investigate enhanced data rate and radio capacity. In some RANs, e.g. as in UMTS, several radio network nodes may be connected, e.g., by landlines or microwave, to a controller node, such as a radio network controller (RNC) or a base station controller (BSC), which supervises and coordinates various activities of the plural radio network nodes connected thereto. The RNCs are typically connected to one or more core networks.

Specifications for the Evolved Packet System (EPS) have been completed within the 3$^{rd}$ Generation Partnership Project (3GPP) and this work continues in the coming 3GPP releases. The EPS comprises the Evolved Universal Terrestrial Radio Access Network (E-UTRAN), also known as the Long Term Evolution (LTE) radio access network, and the Evolved Packet Core (EPC), also known as System Architecture Evolution (SAE) core network. E-UTRAN/LTE is a variant of a 3GPP radio access technology wherein the radio network nodes are directly connected to the EPC core network rather than to RNCs. In general, in E-UTRAN/LTE the functions of an RNC are distributed between the radio network nodes, e.g. eNodeBs in LTE, and the core network. As such, the Radio Access Network (RAN) of an EPS has an essentially "flat" architecture comprising radio network nodes connected directly to one or more core networks, i.e. they are not connected to RNCs.

With the emerging 5G technologies such as new radio (NR), the use of very many transmit- and receive-antenna elements is of great interest as it makes it possible to utilize beamforming, such as transmit-side and receive-side beamforming. Transmit-side beamforming means that the transmitter can amplify the transmitted signals in a selected direction or directions, while suppressing the transmitted signals in other directions. Similarly, on the receive-side, a receiver can amplify signals from a selected direction or directions, while suppressing unwanted signals from other directions.

Next generation nodeBs (gNB) in 5G/NR networks will use active-antenna systems (AAS), equipped with large antenna arrays, to efficiently receive radio signals transmitted by UEs. An example of an AAS receiver architecture for an AAS is illustrated in FIG. 1, which is also called a standard multiple input multiple output (MIMO) receiver architecture. The N arrows on the leftmost side of FIG. 1 represent a number N separate antenna elements, which detect slightly different copies of the UE's radio signal. The radio signal $y_n$ detected on antenna element n (for each n in $\{1, 2, \ldots, N\}$) is a complex waveform with a sampling frequency proportional to the transmission bandwidth.

AASs may comprise N=64 elements and in the future the number of elements may increase. Consider the first "block" in FIG. 1: The received radio signals $x_1, x_2, \ldots, x_N$ are down-converted from the radio-frequency (RF) domain to the baseband (BB)-domain; orthogonal frequency-division multiplexing (OFDM) cyclic prefix is removed; and a Fast Fourier Transform (FFT) is applied taking the signals from the time-domain t to the frequency domain f. The result of which is a sequence of complex BB symbols for each antenna element, wherein the length of this sequence K is equal to the number of resource elements (RE) and/or bandwidth. For antenna element n we denote this sequence by $y_n$.

Following the conversion to BB, AASs then require some computationally heavy signal-processing algorithms. For example, the following procedures may be performed on current AAS products:
  Resource element de-mapping: Resource elements carrying demodulation reference symbols, sounding reference symbols, and data are identified.
  Channel estimation: The channel's impulse response is estimated using a channel estimation algorithm that identifies and extracts the channel's "main" taps.
  Interference estimation: Estimation of the interference-plus-noise covariance matrix.
  Diversity combining: e.g., using a linear Minimum Mean Square Error (MMSE), Interference Rejection Combining (IRC), or Maximal Ratio Combining (MRC) receiver to estimate the complex symbols transmitted on each layer.

The main computing hardware co-located with the antenna array on the radio tower is called a radio unit (RU). It is currently not feasible to perform all of the above signal processing in the RU for various reasons, including, for example, hardware limitations and site-access maintenance limitations. Therefore, some of the abovementioned signal-processing functionality has be moved to a separate baseband unit (BBU). The BBU may be located several kilometers away from the RU and radio tower, e.g., in a powered, secured, easily accessible building.

The communications link between the RU and BBU is called a front-haul link. In 4G LTE and 5G/NR deployments, the front-haul will typically use high-capacity, high data rate, fiber connections. Indoor small cells and future mmW 5G deployments, which have other physical restrictions, such as space and cost, may have different front-haul configurations, e.g. using twisted-pair local area network (LAN) cables or wireless links.

The RU-to-BBU interface used in 4G/LTE networks is often the common public radio interface (CPRI). Although CPRI does not mandate a specific functional split, most deployments use the so called physical (PHY)—RF split shown in FIG. 2 by the line labelled E (option 8). Here, user data consists of time-domain in-phase and quadrature (IQ) samples, with one stream per antenna. FIG. 2 shows an illustration for downlink and uplink of different low-layer functional splits between the RU and BBU. "Option x" refer to 3GPP split points while letters D, E, $I_D$, $II_D$, and $I_U$ refer to eCPRI split points. The two splits in downlink are referred to as $I_D$, $II_D$ and the split point in the uplink is referred to as $I_U$.

It is well-recognized that the PHY-RF split is not suitable for AASs with large antenna arrays, because it requires extremely large front-haul data rates. The following example illustrates this:

LTE with 8 antenna elements (up to 8 MIMO layers), and 20 MHz carrier bandwidth: The required CPRI front-haul data rate using sample rate 30.72 Mbps, 30-bit IQ format and 8B10B line code is 9.8 Gbps, which fits in a rather low-cost 10 Gbps link.

5G/NR AAS with 64 antenna elements, 16 layers and 100 MHz carrier bandwidth: The required CPRI front-haul data rate scales with number of antennas, not number of layers. Sample rate 122.88 Mbps, 30-bit IQ format and 64B66B line code and therefore becomes 259 Gbps but due to link speed granularity, the actual link speed needs to be a bit higher, 12×24.33=292 Gbps. This means 30 times higher front-haul data rate compared with the LTE example, although peak cell rate is only about 10 times higher, i.e. 5 times the carrier bandwidth, 2 times the number of layers.

A front-haul operating at several hundred Gbps requires very expensive optical transmitters and receivers. Moreover, it is not always possible to install a large amount of fiber cables in many deployments, for example, imagine a mmW deployment with gNBs located on every street light.

To address the front-haul data-rate problem, many different functional splits have been proposed by various bodies, including 3GPP and CPRI cooperation. Some of these were illustrated in FIG. 2 above e.g.:

The eCPRI $I_U$ (3GPP option 7-2) functional split. A state of the art AASs might use e.g. the eCPRI $I_U$ split in uplink, in which the N complex sequences described above undergo a port-reduction transform in the frequency domain in the RU. The purpose of this port-reduction is twofold:

It reduces the dimensionality of these signals from [N×K] complex matrices to [M×K] complex matrices, where M is much smaller than N. A consequence of this dimensionality reduction is that less information needs to be transmitted over the front-haul connection from the RU to the BBU.

It reduces computational load at the BBU in the sense that the BBU needs only perform the above operations on M "virtual" antenna ports, rather than the full N antenna ports. There is, of course, also a performance cost associated with this simplification.

The basic idea of the $I_U$ port-reduction transform is as follows:

For each resource element k in $\{1, 2, \ldots, K\}$, the RU collects the N complex-valued OFDM symbols generated by its N antenna elements. Let's denote these symbols by $$x_k = (x_1(k), x_2(k), \ldots, x_N(k))^T$$

where $(\cdot)^T$ denotes the transpose operator. Note: $x_n(k)$ represents the complex symbol for resource element k and antenna element n.

The RU maps the N complex symbols in $x_k$ to M complex symbols $$y_k = (y_1, y_2, \ldots, y_M)^T$$

where M is much smaller than N. This mapping is achieved using a port-reduction transform $$f: \mathbb{C}^N \to \mathbb{C}^M$$

that is, $$y_k = f(x_k)$$

The reduced dimension signal, $y_k$, (for each k in $\{1, 2, \ldots, K\}$) is then communicated from the RU to the BBU over eCPRI.

State-of-the-art port-reduction transforms relate to methods wherein the N-dimensional complex signal $x_k$ is said to be defined in the antenna-element space because its elements are directly associated with the physical signals on each antenna element. The prior-art for this problem defines port-reduction techniques that transform $x_k$ from an antenna-element space into some sparse beam space, so called beam-space transformations. The term sparse here refers to the idea that the transformed signal should have most of its energy concentrated in relatively few dimensions; that is, the signal should be concentrated into relatively few beams. The remaining dimensions, which contain only a small amount of the signal's energy, can then be removed by the RU without significant problems.

Two beam-space transformations that are known to those skilled in the art are based on the following linear operations Discrete Fourier Transforms (DFT)
Singular-value decomposition (SVD)

The DFT-beam-space approach takes the received signal $x_k$ and multiplies it by a two-dimensional DFT matrix W (linear transform). The RU then drops those dimensions of the resulting beam-space signal $y_k = W x_k$ with the least power.

The SVD-beam-space approach first computes the sample covariance matrix R of the received signal over frequency $x_1, x_2, \ldots$, where the averaging occurs over individual subbands or the whole band (wideband). The RU then computes the SVD of R; namely, $R = U\Sigma V^*$, where U and V are unitary matrices, $\Sigma$ is a diagonal (singular values) and * denote the conjugate transpose operator. The RU then truncates U to the M strongest left singular vectors (columns) of U (i.e., removes the weakest singular vectors from U). The strength of each singular vector is given by the size of the corresponding singular value. Each received signal $x_k$ is then multiplied by the truncated U to obtain the beam-space representation.

The DFT- and SVD-beam-space approaches to the port-reduction problem both use linear transforms to reduce the dimension of the received signals $x_k$ from N complex values to M complex values where M is much smaller than N.

The weaker beam-space ports can then be dropped to create an efficient lower-dimension representation of the received signal.

A lower dimensional signal is advantageous for two reasons:
- It requires less information to be communicated from the RU to the BBU.
- The BBU can then operate on a smaller "virtualized" antenna array with fewer beam-space ports than antenna elements. This, in turn, consumes less computation and power in the BBU.

SUMMARY

An object of embodiments herein is to provide a mechanism that handles received signals in a more efficient manner.

According to an aspect the object is achieved by providing a method performed by a radio unit for handling a number of received radio signals over an array of antennas comprised in the radio unit. The radio unit transforms the number of received radio signals into a number of sequences of complex symbols. The radio unit further filters the number of sequences of complex symbols by inputting the number of sequences of complex symbols into a trained computational model comprising an alternating sequence of linear and nonlinear functions and thereby obtaining a reduced number of sequences. The radio unit further transmits the reduced number of sequences to a baseband unit over a front-haul link.

According to another aspect the object is achieved by providing a method performed by baseband unit for handling sequences from a radio unit received over a front-haul link. The baseband unit receives a reduced number of sequences from the radio unit, and decompresses the reduced number of sequences by inputting the reduced number of sequences into a trained computational model comprising an alternating sequence of linear and nonlinear functions and thereby obtaining a number of sequences of complex symbols. The baseband unit further processes the number of sequences of complex symbols for decoding signals received over an array of antennas of the radio unit.

It is furthermore provided herein a computer program product comprising instructions, which, when executed on at least one processor, cause the at least one processor to carry out the method above, as performed by the radio unit or the baseband unit, respectively. It is additionally provided herein a computer-readable storage medium, having stored thereon a computer program product comprising instructions which, when executed on at least one processor, cause the at least one processor to carry out the method according to the method above, as performed by the radio unit or the baseband unit, respectively.

According to yet another aspect of embodiments herein, the object is achieved by providing a radio unit for handling a number of received radio signals over an array of antennas comprised in the radio unit. The radio unit is configured to transform the number of received radio signals into a number of sequences of complex symbols. The radio unit is configured to filter the number of sequences of complex symbols by inputting the number of sequences of complex symbols into a trained computational model comprising an alternating sequence of linear and nonlinear functions and thereby obtaining a reduced number of sequences. The radio unit is configured to transmit the reduced number of sequences to a baseband unit over a front-haul link.

According to still another aspect of embodiments herein, the object is achieved by providing a baseband unit for handling sequences from a radio unit received over a front-haul link. The baseband unit is configured to receive a reduced number of sequences from the radio unit. The baseband unit is configured to decompress the reduced number of sequences by inputting the reduced number of sequences into a trained computational model comprising an alternating sequence of linear and nonlinear functions and thereby obtaining a number of sequences of complex symbols. The baseband unit is configured to process the number of sequences of complex symbols for decoding signals received over an array of antennas of the radio unit.

Using alternating linear and nonlinear transforming may provide far better sparse representations with much better signal concentration than purely linear transforms. Embodiments herein achieve a more accurate approximation of the received signal using fewer dimensions compared to prior art thus handling received signals in a more efficient manner.

BRIEF DESCRIPTION OF THE DRAWINGS

Examples of embodiments herein are described in more detail with reference to attached drawings in which.

DETAILED DESCRIPTION

The SVD and DFT methods mentioned above are both based on linear transforms of "antenna domain" signals into sparse "beam-space domain" signals. Nonlinear transforms can provide far better sparse representations with much better signal concentration than purely linear transforms. Below is an example to illustrate the short-comings of the SVD-approach and linear transforms more generally.

Suppose, hypothetically, that the gNB only has two antenna ports and the received signals on each port are real values instead of complex valued (this is to visualize the points in two dimensions, but the same arguments apply to higher-dimension complex signals):

$$x_k = (x_1(k), x_2(k))^T$$

The problem: Compress $x_k$ from two real numbers to a single real number z so as to minimize the distortion when reconstructing each $x_k$, e.g. using the mean squared error distortion criteria.

Example 1: Hypothetical Signals Dataset 1

Figure 3:
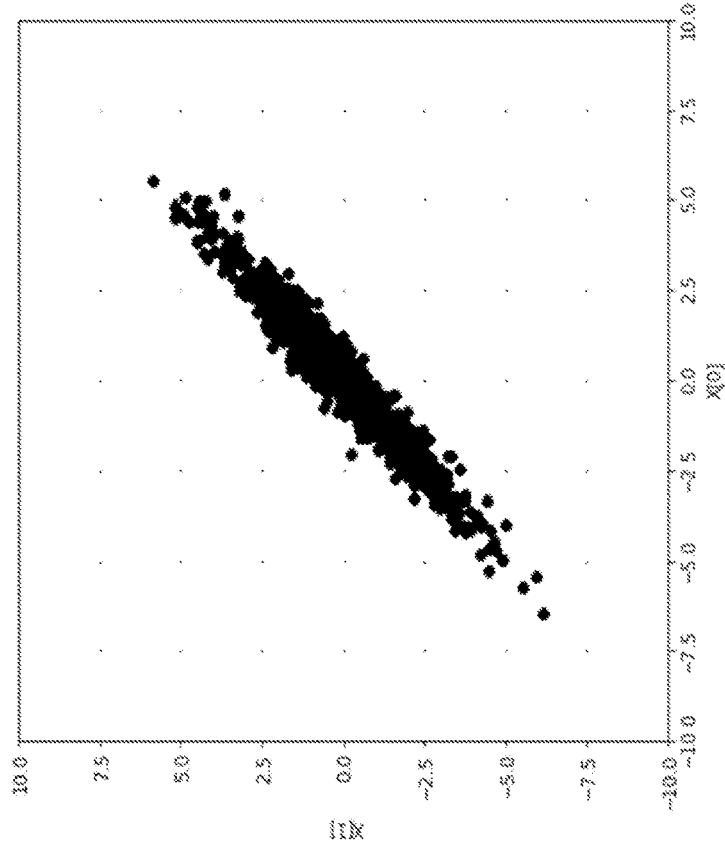
FIG. 3 is a diagram illustrating an example of an SVD-approach.

FIG. 3 shows a hypothetical set of signals $x_1, x_2, \ldots, x_K$ with K=1000. Where points generated as bivariate normal random variables with zero mean and covariance matrix $$R = \begin{bmatrix} 7 & 0 \\ 0 & 0.1 \end{bmatrix}$$

The rotation matrix $$T = \begin{bmatrix} \cos(\theta) & -\sin(\theta) \\ \sin(\theta) & \cos(\theta) \end{bmatrix}$$

is then applied to the data with $$\theta = \frac{\pi}{4}$$

so that the largest variation occurs along the axis $x_1=x_2$.
The SVD-based approach may approximate R by the sample covariance matrix $$R \approx \frac{1}{N} \sum_{k=1}^{K} x_k x_k^H$$

Figure 1:
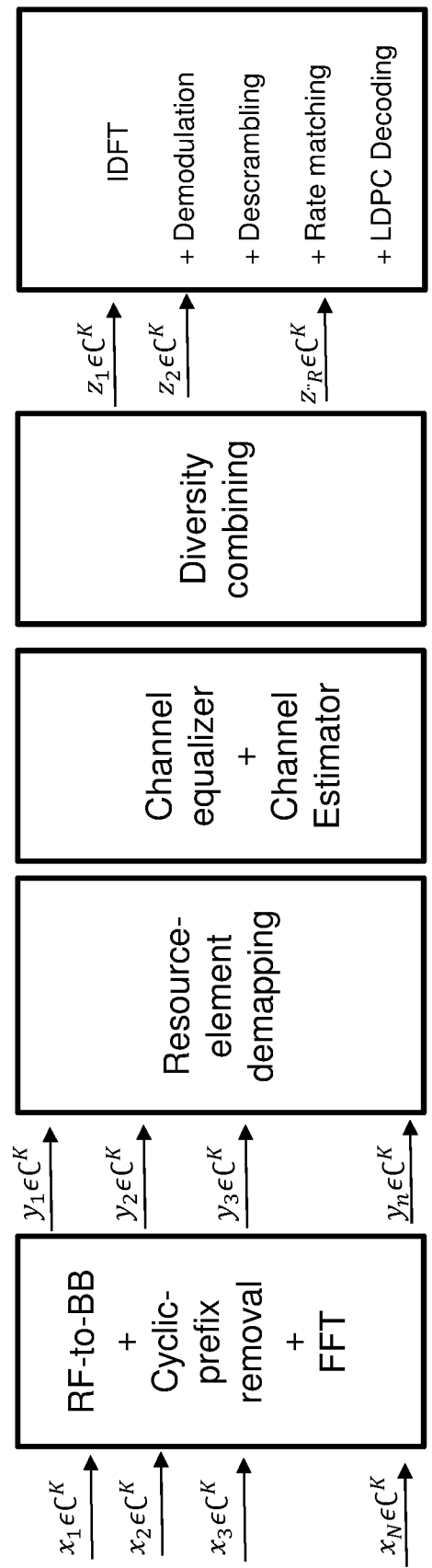
FIG. 1 is an example of an AAS receiver architecture for an AAS.
Figure 2:
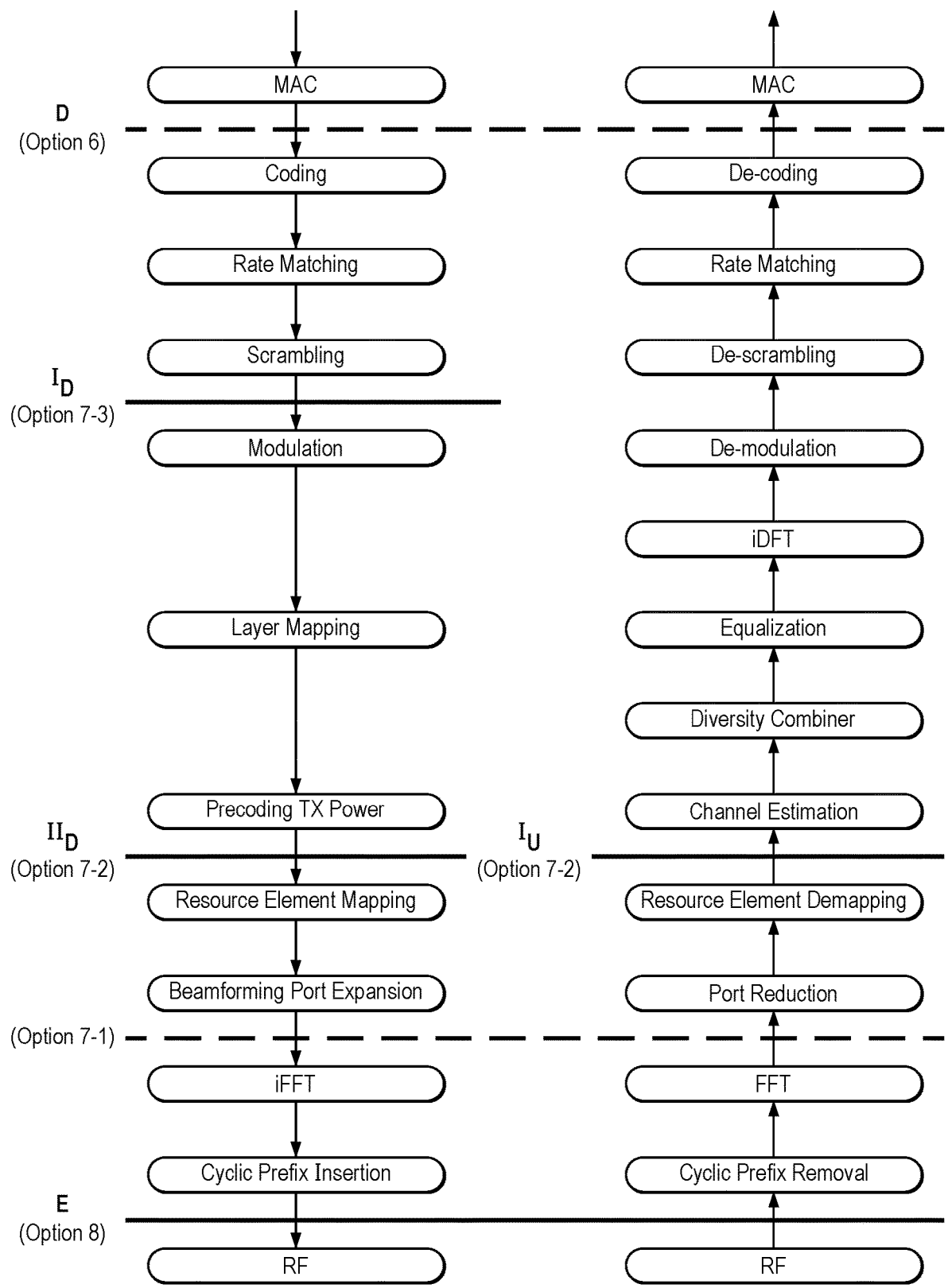
FIG. 2 is an illustration of different low-layer functional splits between a RU and BBU.
Figure 4:
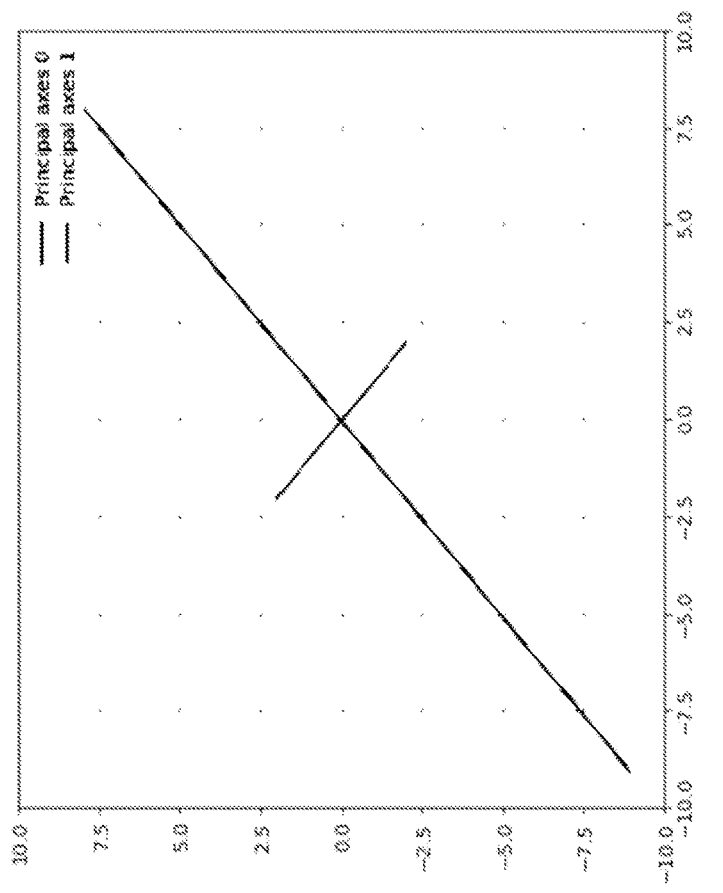
FIG. 4 is a diagram illustrating an example of a linear-approach.

By the law of large numbers, the sample covariance matrix approaches the true covariance matrix R as K grows large (for K=1000 the approximation is already good).
R is then decompressed as $R=UDU^H$ Where U is a (2×2) real matrix and D is diagonal. The first column $U_1$ is then taken from U and the first eigenvalue $d_1$ from D, and compress $x_k$ to z by $z=d_1 U_1 x$ The vector $d_1 W_1$ will simply project $x_k$ onto the line $x_1=x_2$. This line is called the principle axis, see FIG. 4. For this dataset and a mean squared error cost function, this is the optimate projection from two to one dimension, it incurs the least distortion.

Example 2: Hypothetical Signals Dataset 2

Figure 6:
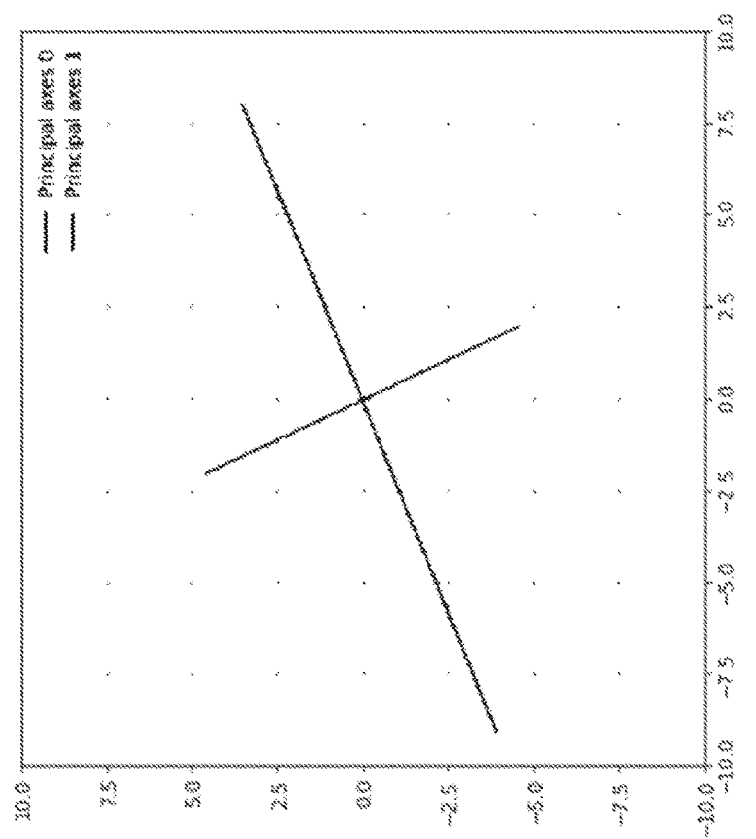
FIG. 6 is a diagram illustrating another example of a linear-approach.
Figure 5:
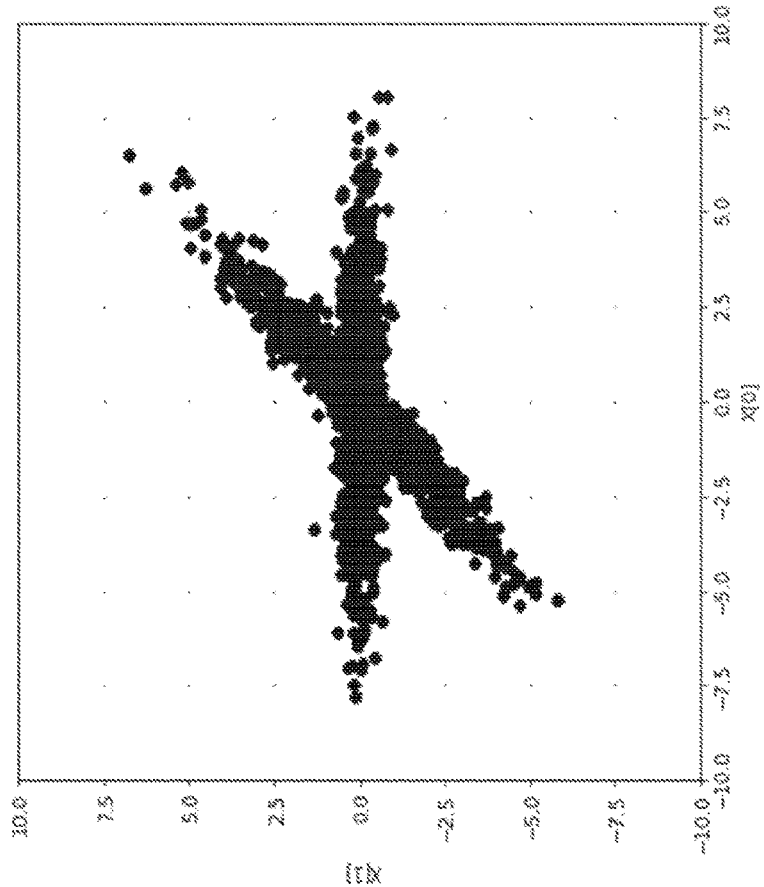
FIG. 5 is a diagram illustrating another example of an SVD-approach.

The problem with the SVD-approach, and linear approaches more generally, comes when the data is more complicated. For example, suppose that points $x_1, x_2, \ldots, x_K$ are described by FIG. 5 showing a hypothetical signal dataset 2. On this dataset 2, the SVD decomposition will place the principle axes somewhere between the two main data clusters, leading to a poor approximation for each cluster the principle axes are shown in FIG. 6.
If the Cumulative Distribution Function (CDF) of the mean squared error, summed over the two components, is plotted for the prior-art approach of applying the SVD on both clusters and separately on each data cluster it is clearly shown that the SVD method does not perform well on this dataset.

The signals $x_1, x_2, \ldots, x_K$ received by a real AAS are far more complicated than the simple example above. However, they do share this basic property: SVD beam-space transforms will not work well when the channel's statistics change significantly over the transmission bandwidth (e.g., over the resource elements). This is why, for example, subband SVD or DFT precoding for data transmission typically outperforms wideband precoding on frequency selective channels.

Figure 7:
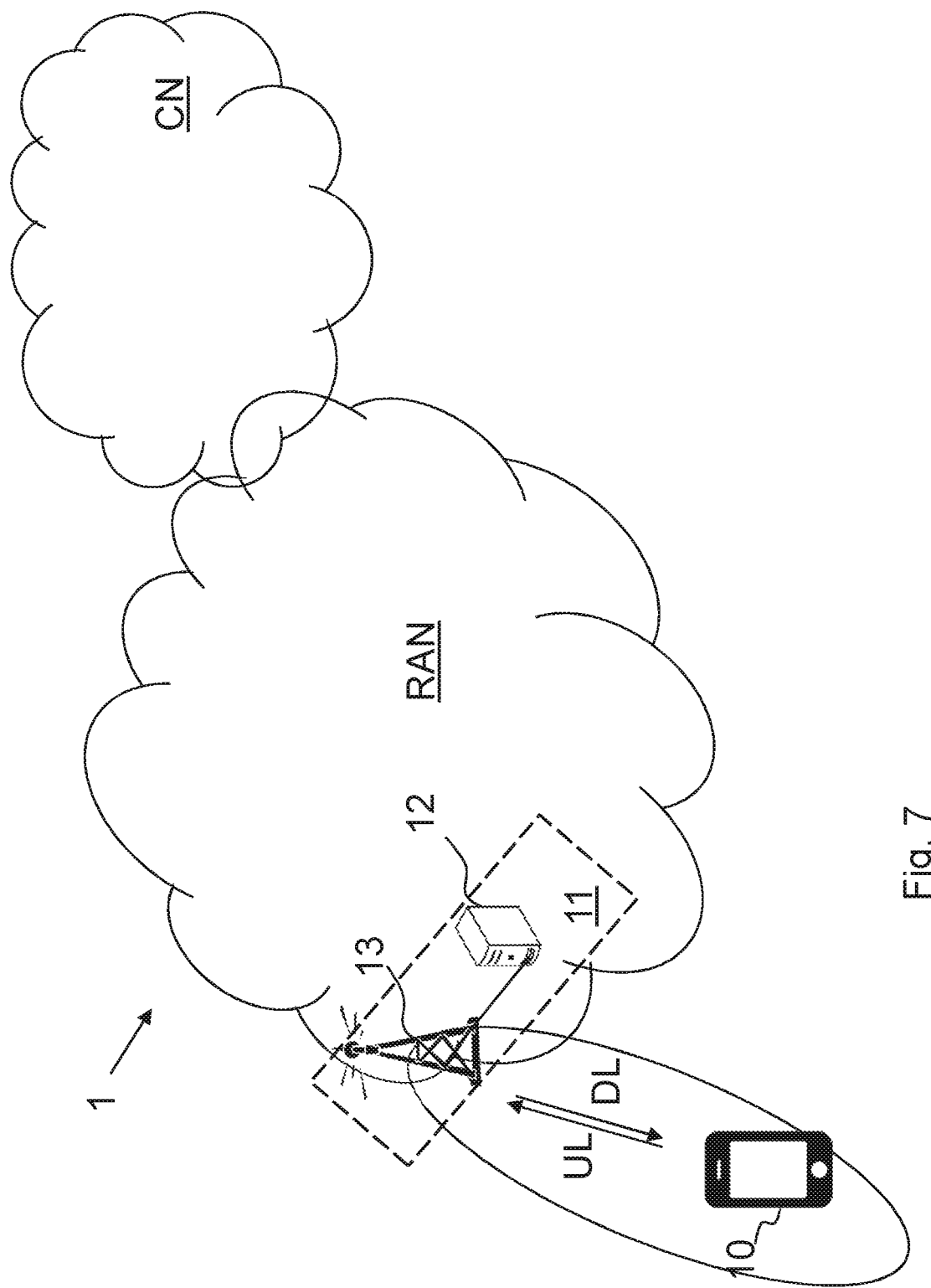
FIG. 7 is a schematic block diagram illustrating embodiments of a communications network.

Embodiments herein relate to wireless communications networks in general. FIG. 7 is a schematic overview depicting a wireless communications network 1. The wireless communications network 1 comprises one or more RANs and one or more CNs. The wireless communications network 1 may use one or a number of different technologies. Embodiments herein relate to recent technology trends that are of particular interest in a New Radio (NR) context, however, embodiments are also applicable in further development of existing wireless communications systems such as e.g. LTE or Wideband Code Division Multiple Access (WCDMA).

In the wireless communications network 1, a user equipment (UE) 10 exemplified herein as a wireless device such as a mobile station, a non-access point (non-AP) station (STA), a STA and/or a wireless terminal, is comprised communicating via e.g. one or more Access Networks (AN), e.g. radio access network (RAN), to one or more core networks (CN). It should be understood by the skilled in the art that "UE" is a non-limiting term which means any terminal, wireless communications terminal, user equipment, narrowband internet of things (NB-IoT) device, Machine Type Communication (MTC) device, Device to Device (D2D) terminal, or node e.g. smart phone, laptop, mobile phone, sensor, relay, mobile tablets or even a small base station capable of communicating using radio communication with a radio network node within an area served by the radio network node.

The wireless communications network 1 comprises a radio network node 11 providing radio coverage over a geographical area, a first service area, of a first radio access technology (RAT), such as NR, LTE, or similar. The radio network node 11 may be a transmission and reception point such as an access node, an access controller, a base station, e.g. a radio base station such as a gNodeB (gNB), an evolved Node B (eNB, eNode B), a NodeB, a base transceiver station, a radio remote unit, an Access Point Base Station, a base station router, a Wireless Local Area Network (WLAN) access point or an Access Point Station (AP STA), a transmission arrangement of a radio base station, a stand-alone access point or any other network unit or node capable of communicating with a wireless device within the area served by the radio network node depending e.g. on the first radio access technology and terminology used. The radio network node may be referred to as a serving radio network node wherein the service area may be referred to as a serving cell, and the serving network node communicates with the wireless device in form of DL transmissions to the wireless device and UL transmissions from the wireless device. It should be noted that a service area may be denoted as cell, beam, beam group or similar to define an area of radio coverage.

The radio network node 11 comprises a base band unit (BBU) 12 and a radio unit (RU) 13. The radio unit 13 may also be referred to as remote radio unit or distributed radio unit. The BBU 12 is connected to the RU 13 by a front-haul link. Embodiments herein propose a method for signal dimension reduction using a non-linear transformation of a number of received signals at the RU 13.

The RU 13 transform the number of received radio signals into a number of sequences of complex symbols, and filters the number of sequences of complex symbols by inputting the number of sequences of complex symbols into a trained computational model comprising an alternating sequence of linear and nonlinear functions and thereby obtaining a reduced number of sequences. The RU 13 then transmits the reduced number of sequences to the BBU 12 over the front-haul link. Thus, reducing the load on the front-haul link but still keeping most relevant data in the transmitted data.

Thus, the radio unit 13 may filter the number of sequences of complex symbols by inputting the number of sequences of complex symbols into the trained computational model.

The trained computational model consists of the alternating sequence of linear and nonlinear functions. More specifically, this alternating sequence can be denoted by $f_{L,1} \to f_{NL,1} \to f_{L,2} \to f_{NL,2} \to \ldots \to f_{NL,K}$ where $f_{L,k}$ represents the k-th linear function, $f_{NL,k}$ represents the k-th nonlinear function, and $f_{L,k} \to f_{NL,k}$ means that the output of $f_{L,k}$ is input to $f_{NL,k}$.

The linear functions $f_{L,1}, f_{L,2}, \ldots$ may be one or more matrix multiplications (as in feedforward fully connected neural network) or one or more matrix convolutions (as in the convolution layer of a convolutional neural network).

The nonlinear functions $f_{NL,1}, f_{NL,2}, \ldots$ may be differentiable nonlinear activation functions mapping a real-value to another real-value (vectorized over the variables) or "pooling" functions that drop subsets of their inputs.

This alternating sequence of linear and nonlinear functions may be split into two parts: An encoder part (corresponding to $f_{L,1} \to f_{NL,1} \to f_{L,2} \to \ldots \to f_{NL,K}$ for some k<K and a decoder part $f_{L,k+1} \to f_{NL,k+1} \to \ldots \to f_{NL,K}$.

The output of the middle function $f_{NL,k}$ is a low-dimension representation of the input $x_k$, and this low-dimension representation is transmitted over the fronthaul link from the RU 13 to the BBU 12.

Embodiments herein propose a method for signal dimension reduction using a non-linear transformation. The dimension reduction is implemented by the trained computational model such as a specific nonlinear convolutional neural network autoencoder structure, which is used to remove correlations between non-orthogonal beams in e.g. an oversampled DFT beam-space domain.

Below are embodiments herein explained with the radio network node 11 exemplified as a gNB comprising a Uniform Linear Array (ULA) with N antenna elements but may also be applied to uniform planar arrays (UPA).

For each resource element k in $\{1, 2, \ldots, K\}$, the RU 13 observes an N-dimensional complex sequence $x_k \in \mathbb{C}^N$ in the antenna domain, with one symbol per antenna element.

The RU 13 selects an oversampled DFT codebook, e.g. a codebook matrix, with an oversampling factor Q≥1.

The RU 13 transforms the N-dimensional complex sequence $x_k$ to the DFT beam-space domain; that is, it computes $z_k = W x_k$, where $z_k \in \mathbb{C}^{QN}$. The dimension of $z_k$ may be Q-times larger than the original N-dimensional complex sequence $x_k$ based on the oversampling factor.

The RU 13 may apply a fixed nonlinear transformation $f_{nl}$ to $z_k$ to get a reduced-dimension representation of the signal, wherein the reduced dimension representation of the signal may be defined by $v_k = f_{nl}(z_k) \in \mathbb{C}^M$. The dimension of reduced dimension representation $v_k$ is M, where M≤N≤QN, typically M is chosen to be much smaller than N. The reduced dimension representation may also be referred to as the reduced number of sequences. It should be noted that the nonlinear transformation $f_{nl}$ is a trained computational model that is built from (or comprised of) an alternating sequence of linear and nonlinear functions. The transformation $f_{nl}$ is a nonlinear transform, because the alternating sequence of linear and nonlinear functions combine to yield to a nonlinear function.

The trained computational model may comprise
  a. Select one or more beams with a most received energy $a_k^* = \mathrm{argmax}_a \|W(a,:)x_k\|_F^2$; for e.g. each subband s.
  b. Remove all rows $W(a_k,:)$ that are not orthogonal to the one or more beams $W(a_k^*,:)$. These rows $W(a_k,:)$ are removed to ensure that the beam-space basis is built on an orthonormal basis, which may then help with energy concentration in the beam-space domain.
  c. Finally, the RU 13 selects the M strongest beams from the remaining N orthonormal beams; which may be transmitted to the BBU 12; and the BBU 12 processes these signals.

In contrast to the DFT method embodiments herein do not remove non-orthogonal beams. Some of these beams may contain significant received signal energy and can, therefore, be useful to the BBU 12. It is argued that non-orthogonal beams need to be removed to improve compression performance, i.e., if the beams are not orthogonal, then the signals will be correlated and, therefore, further compression performance can be achieved. However, embodiments herein achieve good dimension reduction by applying the trained auto-encoder such as a specific nonlinear convolutional neural network autoencoder structure to remove correlations between non-orthogonal beams. The application of such nonlinear methods is novel. Thus, the trained computational model comprising the alternating sequence of linear and nonlinear functions may thus be a trained autoencoder.

The BBU 12 may then recover the B strongest beams from the reduced dimension representation $v_k$, which we denote by $b_k$ using another nonlinear transform $$g: \mathbb{C}^M \to \mathbb{C}^B$$

Where M≤B.

The idea that the BBU 12 recovers B beams from the reduced dimension representation also denoted as compressed signal of dimension M≤B is new.

Thanks to the specific non-linear transformation used herein, substantial dimension reduction is achieved, even for cases where SVD and similar methods would fail.

Figure 8:
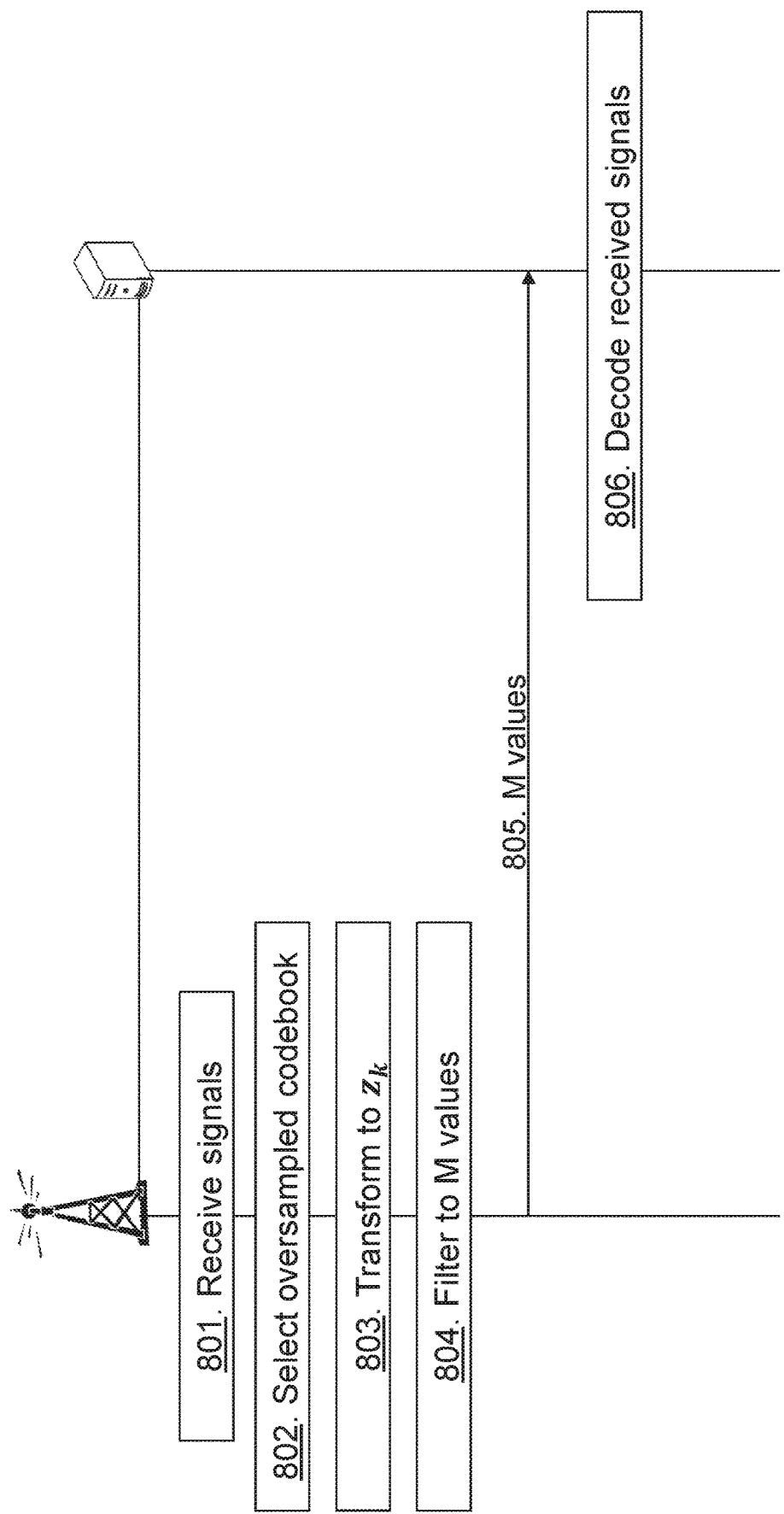
FIG. 8 is a combined signalling scheme and flowchart depicting embodiments herein.

FIG. 8 is a combined signalling scheme and flowchart depicting embodiments herein, providing a method performed by the radio unit 13 comprising a number of received radio signals over an array of antennas, or antenna elements, comprised in the radio unit 13 e.g. a gNB with a UPA with a number of elements $N_v$ in a vertical domain and a number of elements $N_h$ in the horizontal domain.

Action 801. For each resource element k in $\{1, 2, \ldots, K\}$, the RU 13 receives and observes an N-dimensional complex sequence $x_k \in \mathbb{C}^N$ in the antenna domain (with one symbol per antenna element). The trained autoencoder has two parts: An encoder part that is used in the RU 13, and a decoder part that is used in the BBU 12.

Action 802. The RU 13 may select a two-dimension oversampled DFT codebook with oversampling factors $Q_v \geq 1$ and $Q_h \geq 1$ in the vertical and horizontal domains respectively. The RU 13 may thus transform the received signal (antenna domain) to an oversampled beamspace domain. The signal in the beamspace domain may be denoted by z and it has N×Qv×Qh values, where Qv and Qh are the vertical and horizontal oversampling factors (integers greater than or equal to 1).

1. The BBU uses the decoder part of the trained autoencoder to reconstruct the signals corresponding to the B strongest DFT beams. Here B is greater than M. I.e., the B values are not communicated over the front-haul.

Action 803. The RU 13 transforms the N-dimensional complex sequence $x_k \in \mathbb{C}^N$ to the oversampled DFT beamspace domain; that is, it computes $z_k = W\, x_k$, where $z_k \in \mathbb{C}^{Q_v \times Q_h \times N}$ is a three dimension tensor and W is a 2-dimensional oversampled DFT codebook. Thus, embodiments herein may use multiplication by an oversampled DFT matrix, which is W in Action 803. If the DFT oversampling factor is 2 (or larger) then prior art will, in part, reduce the dimension by "throwing away" all but one of the DFT bases. Embodiments herein do not throw away these bases, and, instead an autoencoder is used to remove unwanted correlations.

Action 804. The RU 13 further filters the oversampled complex sequence in the trained model into M values. The trained computational model is an alternating sequence of linear and nonlinear functions. The first half of this alternating sequence is called the encoder, and the second half of this alternating sequence is called the decoder. The "middle part", which connects the encoder and decoder, is comprised of M values, where B≤M<<N. These M values are communicated over the front-haul from the RU 13 to the BBU.

Action 805. The RU 13 then further transmits the M values to the BBU 12. The RU 13 may thus use the encoder part of the trained autoencoder to compress z to M values, where M is much smaller than N. These M values are transported over the front-haul to the BBU 12.

Action 806. The BBU 12 receives and uses a corresponding trained computational model for decoding signals received over the array of antennas of the radio unit 13. E.g. the BBU 12 may use the decoder part of the trained autoencoder to reconstruct the sequences for the strongest B beams.

Figure 9:
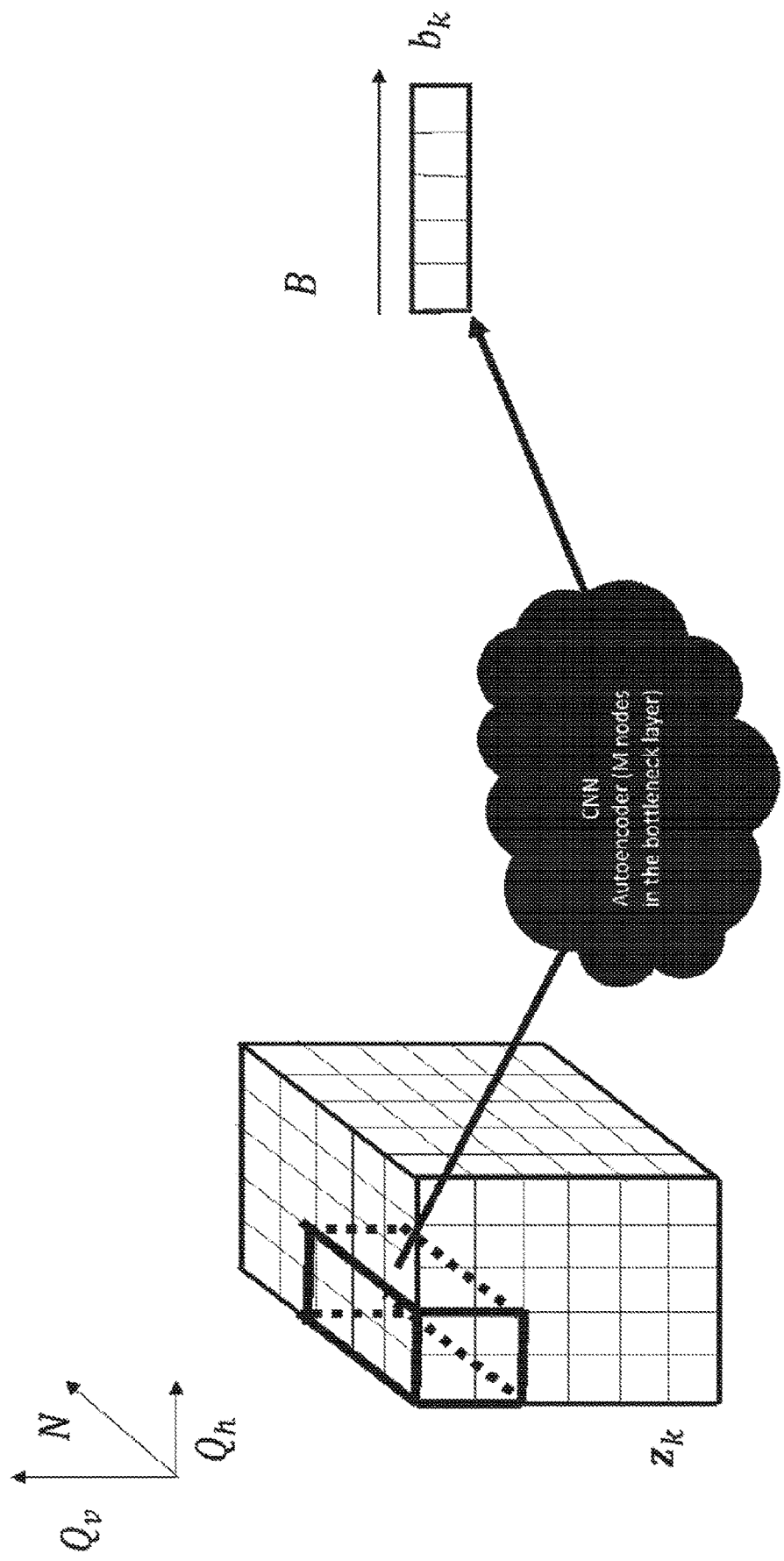
FIG. 9 is a schematic overview illustrating an example of computing a Discrete Fourier Transform over-sampling the number of sequences of complex symbols increasing the beam search space.

FIG. 9 discloses an example of how to compute the Discrete Fourier Transform, DFT, over-sampling the number of sequences of complex symbols increasing the beam search space. The x-axis corresponds to the horizontal oversampling factor; the y corresponds to the vertical oversampling factor; and the z-axis corresponds to the DFT beam index (for the particular pair of oversampling factors).

For large antenna arrays, it is likely that the tensor will be sparse; that is, the elements of $z_k$ with significant energy will be clustered in a way that matches a spatial distribution of UEs.

A convolutional autoencoder may be used to encode this tensor into M complex values (physically performed by the RU 13) and reconstruct the signals associated with the strongest B beams. This would be physically performed in the BBU 12, taking the above M values as input. I.e. these M values may be transmitted over the front-haul from the RU 13 to the BBU 12.

The convolutional autoencoder may be trained offline using measured channel impulse response data.

The loss function, which quantifies the reconstruction fidelity during training, is computed on a subband level: For a known dimensional training sample $x \in \mathbb{C}^N$ (where N represents the number of antenna ports at the radio unit 13), we perform the following steps:

Compute the 3-dimensional beam-space representation $z \in \mathbb{C}^{Q_v \times Q_h \times N}$.

Find the B elements of z with the largest amplitudes. Let A denote the coordinates of these B largest elements.

We then "push" x through the trained computational model such as a neural network and obtain B output values b.

The loss (MSE error) on these B values is then:

$$L(x,b) := \Sigma_{(i,j,k) \in A} \|z(i,j,k) - b\|$$

Using this loss function, the weights and biases of the convolutional network can then be numerically optimized using various forms of gradient descent.

Figure 10:
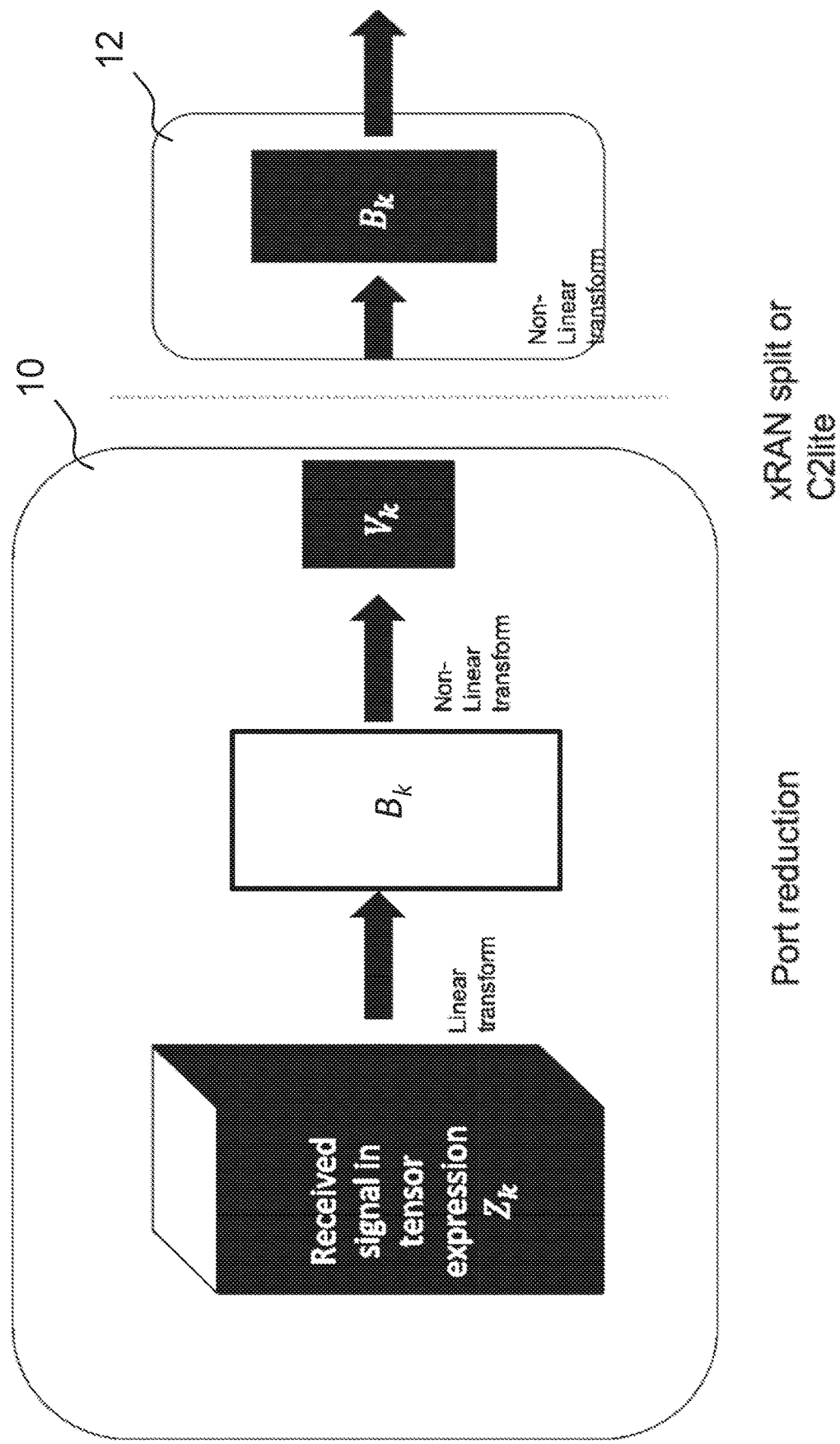
FIG. 10 is a schematic block diagram depicting some embodiments herein.

FIG. 10 illustrates an embodiment in a block diagram.

The received signal is first transformed into number of sequences of complex values. The sequences may be oversampled using e.g. a DFT matrix or similar into oversampled number of sequences $Z_k$. In an embodiment, the transform or filtering from the oversampled number of sequences $Z_k$ to the complex values $B_k$ may be linear, which may be formulated as a matrix multiplication. For instance, reshape the tensor $Z_k$ to be a vector with the dimension $Q_v * Q_h * N$ by 1. $B_k$ may be calculated via the multiplication of $Z_k$ and selection matrix $S_k$ with dimension $Q_v * Q_h * N$ by B. i.e., $$B_k = S_k * Z_k, \text{ where } S_k \in C^{\{Q_v \times Q_h * N \times B\}}$$

By this means, the reconstructed beam space signal may be enforced to be confined in the linear space of the received signal before compression. Therefore, it does not impact the linear receivers in the later baseband unit 12.

The transform from complex values $B_k$ to the reduced number of sequences $V_k$ and the inverse transform from $V_k$ to $B_k$ may be both non-linear functions. The non-linear functions, i.e. the trained computational model, may be trained via an auto-encoder and auto-decoder, respectively.

In an embodiment, there does not exist an explicit linear transformation $S_k$ in the proposed port reduction scheme. The transform from $Z_k$ to $V_k$ may be directly trained over an auto-encoder. The autoencoder can be trained to do a better compression than the linear S-function above. I.e., S is not used directly. But, of course, the autoencoder may have linear components inside it.

In another embodiment, if the proposed port reduction scheme is applied before the resource element de-mapping, i.e., $v_k$ may be transmitted over the xRan split interface.

Figure 11:
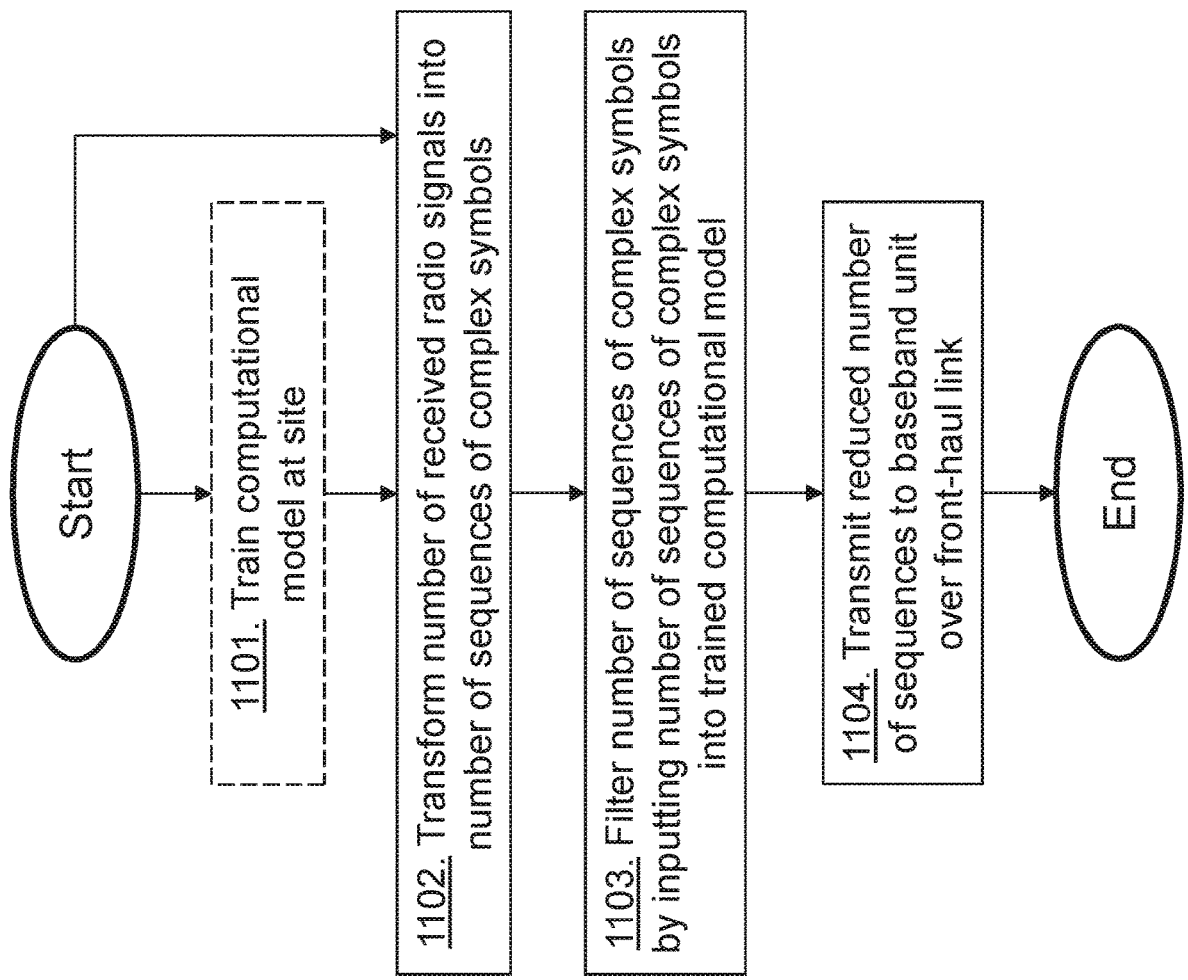
FIG. 11 is a flowchart depicting embodiments of a method performed by a radio unit in the communications network.

The method actions performed by the radio unit 13 for handling the number of received radio signals over the array of antennas comprised in the radio unit 13 according to embodiments will now be described with reference to a flowchart depicted in FIG. 11. The actions do not have to be taken in the order stated below, but may be taken in any suitable order. Actions performed in some embodiments are marked with dashed boxes.

Action 1101. The radio unit 13 may train the computational model at site of the radio unit 13.

Action 1102. The radio unit 13 transform the number of received radio signals into the number of sequences of complex symbols. There may be one or more sequences per antenna port such as subarrays. Each sequence may thus represent beam direction and/or port. The radio unit 13 may transform the number of received radio signals by DFT over-sampling the number of sequences of complex symbols. Thus, the number of sequences of complex symbols is increased and thereby is the beam search space increased. The DFT over-sampling may be performed by using a DFT matrix multiplication on the number of sequences of complex symbols. For large N, oversampled DFT may be performed more efficiently by zero padding the input to a fast Fourier transform (FFT).

Action 1103. The radio unit 13 filters the number of sequences of complex symbols by inputting the number of sequences of complex symbols into the trained computational model comprising the alternating sequence of linear and nonlinear functions and thereby obtaining the reduced number of sequences. The radio unit may filter the number of sequences of complex symbols by inputting the DFT over-sampled number of sequences into the trained computational model. The trained computational model may comprise an auto-encoder. The trained computational model may comprise a convolutional auto-ender or neural network, a recurrent auto-ender or neural network, a neural Turing machine, and/or a perceptron. E.g. any other function whose parameters can be trained using historical data and a fixed cost function.

Action 1104. The radio unit 13 further transmits the reduced number of sequences to the baseband unit 12 over the front-haul link.

Embodiments herein may thus use a trained autoencoder to do dimensionality reduction over the front-haul. Prior art simply selects the strongest DFT or SVD beamspace dimensions. E.g. embodiments herein may use a trained autoencoder to compress and reconstruct a beamspace signal Z (oversampled DFT) for transmission over the front-haul. We may thus keep all of the DFT bases, and use the trained autoencoder to handle correlations between the different bases.

Figure 12:
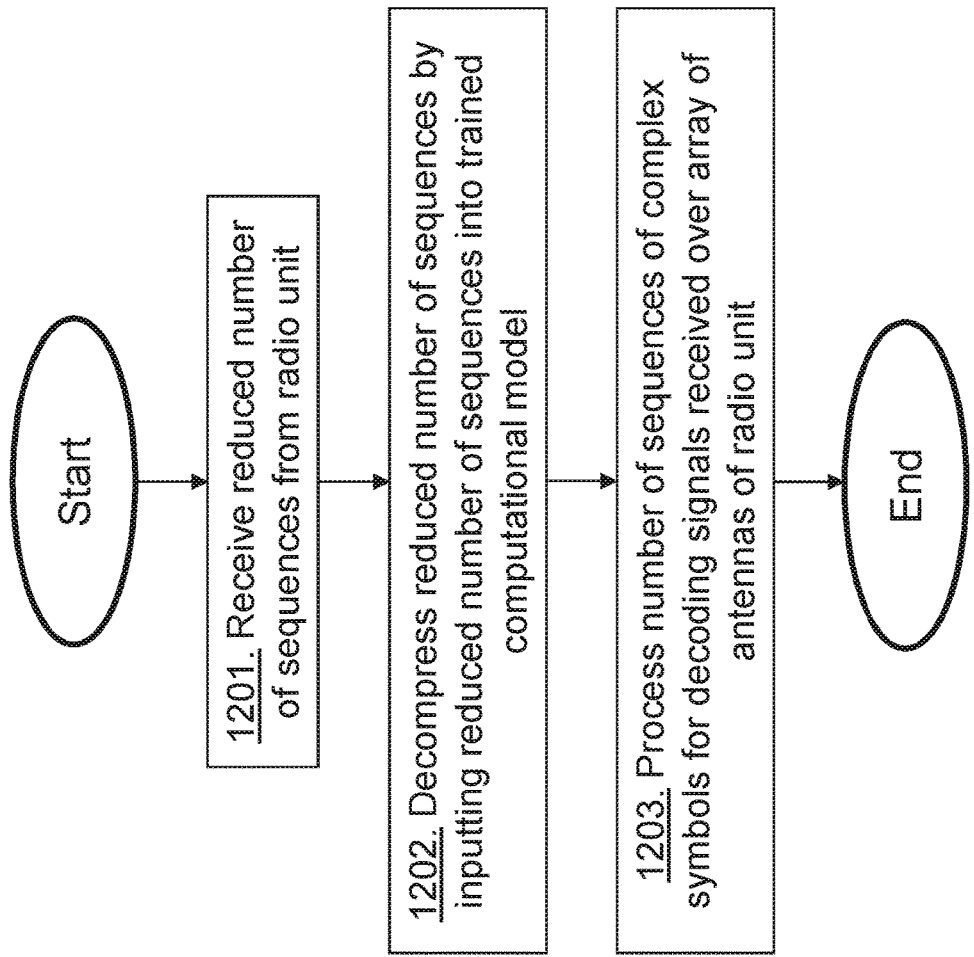
FIG. 12 is a flowchart depicting embodiments of a method performed by a baseband unit in the communications network.

The method actions performed by the BBU 12 for handling sequences from the radio unit 13 received over the front-haul link according to embodiments will now be described with reference to a flowchart depicted in FIG. 12.

Action 1201. The BBU 12 receives the reduced number of sequences from the radio unit 13. E.g. the autoencoder outputs the complex vector b, which consists of B complex numbers. The BBU 12 may treat each element of b as a "virtual antenna element". That is, we've gone from M physical antenna elements on the antenna down to B "virtual antenna elements" in the BBU 12.

Action 1202. The BBU 12 decompresses the reduced number of sequences by inputting the reduced number of sequences into a trained computational model comprising an alternating sequence of linear and nonlinear functions and thereby obtaining a number of sequences of complex symbols. The trained computational model may comprise an auto-decoder. An autoencoder may have two parts: an encoder part and a decoder part. The decoder part may be in the BBU 12, and the encoder part may be in the RU 13. The BBU 12 uses the decoder part to reconstruct B from the compressed Z. The trained computational model may comprise a convolutional auto-decoder, a recurrent auto-decoder, a neural Turing machine, and/or a perceptron.

Action 1203. The BBU 12 further processes the number of sequences of complex symbols for decoding signals received over an array of antennas of the radio unit. The BBU 12 may thus operate as normal with B antenna elements. E.g., it will perform:

Resource element demapping,
Channel estimation
Interference estimation
Etc.

Embodiments herein reduce M physical antenna elements down to B virtual antenna elements in way that works well with the front-haul capacity limitations.

Figure 13:
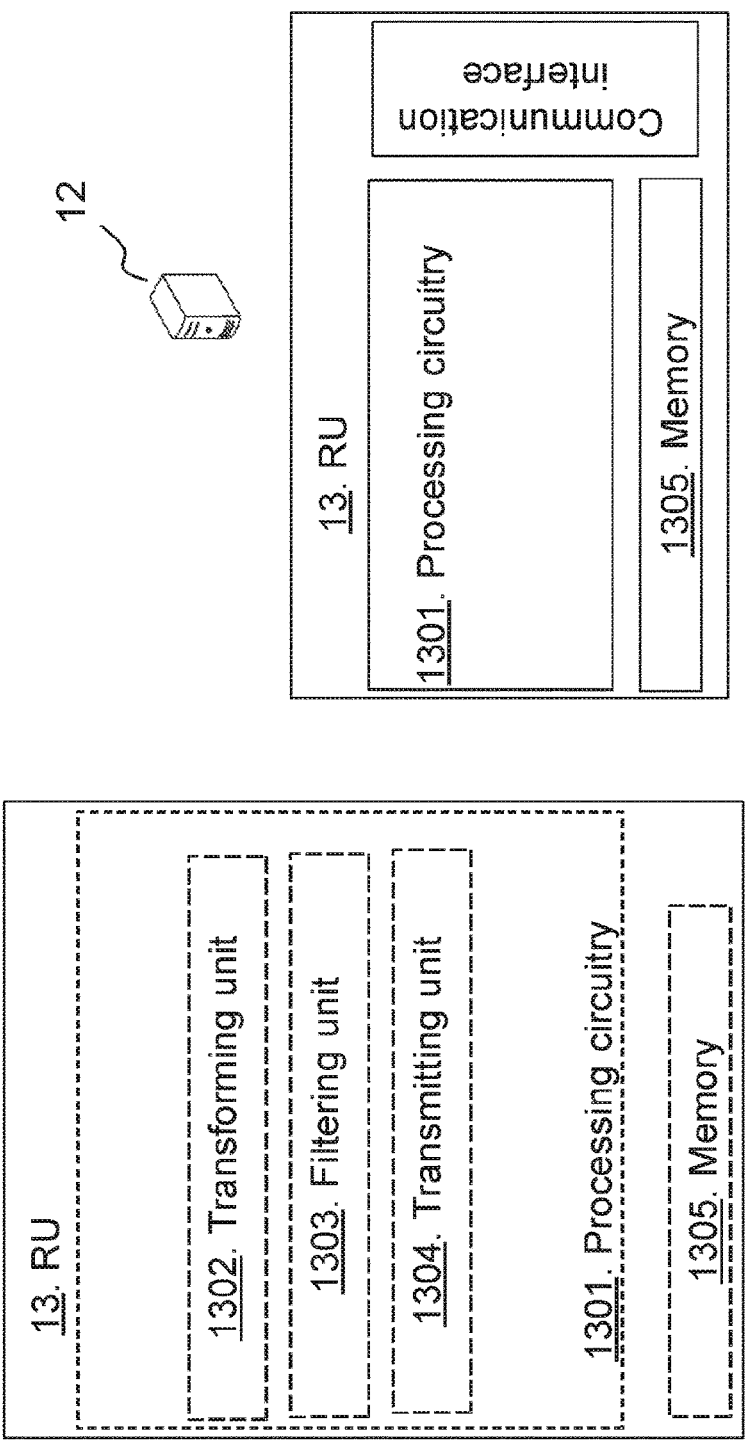
FIG. 13 is a schematic block diagram illustrating a radio unit according to embodiments herein.

FIG. 13 is a block diagram depicting the radio unit 13 for handling a number of received radio signals over an array of antennas comprised in the radio unit 13 according to embodiments herein.

The radio unit 13 may comprise processing circuitry 1301, e.g. one or more processors, configured to perform the methods herein.

The radio unit 13 may comprise a transforming unit 1302. The radio unit 13, the processing circuitry 1301, and/or the transforming unit 1302 is configured to transform the number of received radio signals into a number of sequences of complex symbols.

The radio unit 13, the processing circuitry 1301, and/or the transforming unit 1302 may be configured to train the computational model at site.

The radio unit 13 may comprise a filtering unit 1303. The radio unit 13, the processing circuitry 1301, and/or the filtering unit 1303 is configured to filter the number of sequences of complex symbols by inputting the number of sequences of complex symbols into the trained computational model comprising the alternating sequence of linear and nonlinear functions and thereby obtaining the reduced number of sequence. The trained computational model may comprise the auto-encoder. The trained computational model may comprise a convolutional auto-ender, a recurrent auto-ender, a neural Turing machine, and/or a perceptron.

The radio unit 13, the processing circuitry 1301, and/or the transforming unit 1302 may be configured to transform the number of received radio signals by being configured to DFT over-sample the number of sequences of complex symbols. The radio unit 13, the processing circuitry 1301, and/or the filtering unit 1303 may be configured to filter the number of sequences of complex symbols by being configured to input the DFT over-sampled number of sequences into the trained computational model. The radio unit 13, the processing circuitry 1301, and/or the transforming unit 1302 may be configured to DFT over-sample by using the DFT matrix multiplication on the number of sequences of complex symbols.

The radio unit 13 may comprise a transmitting unit 1304. The radio unit 13, the processing circuitry 1301, and/or the transmitting unit 1304 is configured to transmit the reduced number of sequences to the baseband unit 12 over the front-haul link.

The radio unit 13 further comprises a memory 1305. The memory 1305 comprises one or more units to be used to store data on, such as radio signals, sequences of sequence of linear and nonlinear functions and symbols, data such as machine learning algorithms, configuration, input/output data, metadata, etc. and applications to perform the methods disclosed herein when being executed, and similar. The radio unit 13 may further comprise a communication interface comprising e.g. one or more antenna or antenna elements.

The methods according to the embodiments described herein for the radio unit 13 are respectively implemented by means of e.g. a computer program product 1306 or a computer program, comprising instructions, i.e., software code portions, which, when executed on at least one processor, cause the at least one processor to carry out the actions described herein, as performed by the radio unit 13. The computer program product 1306 may be stored on a computer-readable storage medium 1307, e.g. a disc, a universal serial bus (USB) stick or similar. The computer-readable storage medium 1307, having stored thereon the computer program product, may comprise the instructions which, when executed on at least one processor, cause the at least one processor to carry out the actions described herein, as performed by the radio unit 13. In some embodiments, the computer-readable storage medium may be a transitory or a non-transitory computer-readable storage medium.

Figure 14:
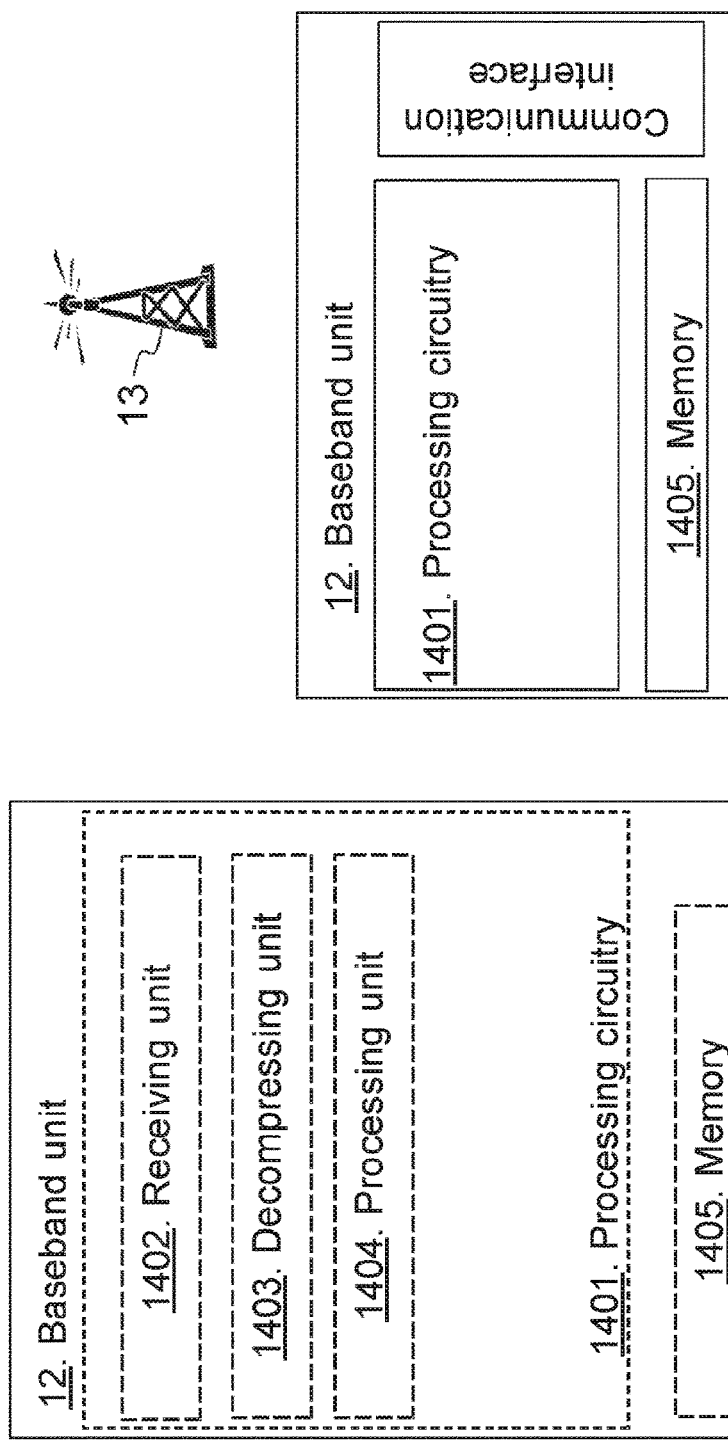
FIG. 14 is a schematic block diagram illustrating a baseband unit according to embodiments herein.

FIG. 14 is a block diagram depicting the baseband unit 12 for handling sequences from the radio unit 13 received over the front-haul link according to embodiments herein.

The baseband unit 12 may comprise processing circuitry 1401, e.g. one or more processors, configured to perform the methods herein.

The baseband unit 12 may comprise a receiving unit 1402. The baseband unit 12, the processing circuitry 1401, and/or the receiving unit 1402 is configured to receive the reduced number of sequences from the radio unit 13.

The baseband unit 12 may comprise a decompressing unit 1403. The baseband unit 12, the processing circuitry 1401, and/or the decompressing unit 1403 is configured to decompress the reduced number of sequences by inputting the reduced number of sequences into the trained computational model comprising the alternating sequence of linear and nonlinear functions and thereby obtaining the number of sequences of complex symbols. The trained computational model may comprise an auto-decoder. The trained computational model may comprise the convolutional auto-decoder, the recurrent auto-decoder, the neural Turing machine, and/or the perceptron.

The baseband unit 12 may comprise a processing unit 1404. The baseband unit 12, the processing circuitry 1401, and/or the processing unit 1404 is configured to process the number of sequences of complex symbols for decoding signals received over the array of antennas of the radio unit 13.

The baseband unit 12 further comprises a memory 1405. The memory 1405 comprises one or more units to be used to store data on, such as radio signals, sequences of sequence of linear and nonlinear functions and symbols, data such as machine learning algorithms, configuration, input/output data, metadata, sharing policies and required capabilities, system/subsystem references, etc. and applications to perform the methods disclosed herein when being executed, and similar. The baseband unit 12 may further comprise a communication interface comprising e.g. one or more antenna or antenna elements.

The methods according to the embodiments described herein for the baseband unit 12 are respectively implemented by means of e.g. a computer program product 1406 or a computer program, comprising instructions, i.e., software code portions, which, when executed on at least one processor, cause the at least one processor to carry out the actions described herein, as performed by the baseband unit 12. The computer program product 1406 may be stored on a computer-readable storage medium 1407, e.g. a disc, a universal serial bus (USB) stick or similar. The computer-readable storage medium 1407, having stored thereon the computer program product, may comprise the instructions which, when executed on at least one processor, cause the at least one processor to carry out the actions described herein, as performed by the baseband unit 12. In some embodiments, the computer-readable storage medium may be a transitory or a non-transitory computer-readable storage medium.

In some embodiments a more general term "radio network node" is used and it can correspond to any type of radio-network node or any network node, which communicates with a wireless device and/or with another network node. Examples of network nodes are gNodeB, eNodeB, NodeB, MeNB, SeNB, a network node belonging to Master cell group (MCG) or Secondary cell group (SCG), base station (BS), multi-standard radio (MSR) radio node such as MSR BS, eNodeB, network controller, radio-network controller (RNC), base station controller (BSC), relay, donor node controlling relay, base transceiver station (BTS), access point (AP), transmission points, transmission nodes, Remote radio Unit (RRU), Remote Radio Head (RRH), nodes in distributed antenna system (DAS), etc.

In some embodiments the non-limiting term wireless device or user equipment (UE) is used and it refers to any type of wireless device communicating with a network node and/or with another wireless device in a cellular or mobile communication system. Examples of UE are target device, device to device (D2D) UE, proximity capable UE (aka ProSe UE), machine type UE or UE capable of machine to machine (M2M) communication, Tablet, mobile terminals, smart phone, laptop embedded equipped (LEE), laptop mounted equipment (LME), USB dongles etc.

Embodiments are applicable to any radio access technology (RAT) or multi-RAT systems, where the devices receives and/or transmit signals, e.g. data, such as New Radio (NR), Wi-Fi, Long Term Evolution (LTE), LTE-Advanced, Wideband Code Division Multiple Access (WCDMA), Global System for Mobile communications/enhanced Data rate for GSM Evolution (GSM/EDGE), Worldwide Interoperability for Microwave Access (WiMax), or Ultra Mobile Broadband (UMB), just to mention a few possible implementations.

As will be readily understood by those familiar with communications design, that functions means or circuits may be implemented using digital logic and/or one or more microcontrollers, microprocessors, or other digital hardware. In some embodiments, several or all of the various functions may be implemented together, such as in a single application-specific integrated circuit (ASIC), or in two or more separate devices with appropriate hardware and/or software interfaces between them. Several of the functions may be implemented on a processor shared with other functional components of a wireless device or network node, for example.

Alternatively, several of the functional elements of the processing units discussed may be provided through the use of dedicated hardware, while others are provided with hardware for executing software, in association with the appropriate software or firmware. Thus, the term "processor" or "controller" as used herein does not exclusively refer to hardware capable of executing software and may implicitly include, without limitation, digital signal processor (DSP) hardware and/or program or application data. Other hardware, conventional and/or custom, may also be included. Designers of communications devices will appreciate the cost, performance, and maintenance trade-offs inherent in these design choices.

It will be appreciated that the foregoing description and the accompanying drawings represent non-limiting examples of the methods and apparatus taught herein. As such, the apparatus and techniques taught herein are not limited by the foregoing description and accompanying drawings. Instead, the embodiments herein are limited only by the following claims and their legal equivalents.

The invention claimed is:

1. A method performed by a radio unit for handling a number of received radio signals over an array of antennas comprised in the radio unit, the method comprising:
    transforming the number of received radio signals into a number of sequences of complex symbols;
    filtering the number of sequences of complex symbols by inputting the number of sequences of complex symbols into a trained computational model comprising an alternating sequence of linear and nonlinear functions and thereby obtaining a reduced number of sequences; and
    transmitting the reduced number of sequences to a baseband unit over a front-haul link.

2. The method according to claim 1, wherein transforming the number of received radio signals comprises Discrete Fourier Transform (DFT) over-sampling the number of sequences of complex symbols; and wherein filtering the number of sequences of complex symbols comprises inputting the DFT over-sampled number of sequences into the trained computational model.

3. The method according to claim 2, wherein the DFT over-sampling is performed by using a DFT matrix multiplication on the number of sequences of complex symbols.

4. The method according to claim 1, wherein the trained computational model comprises an auto-encoder.

5. The method according to claim 1, wherein the trained computational model comprises a convolutional auto-encoder, a recurrent auto-encoder, a neural Turing machine, a perceptron, or any combination thereof.

6. The method according to claim 1, further comprising training the computational model at site.

7. A method performed by a baseband unit for handling sequences from a radio unit received over a front-haul link, the method comprising:
    receiving a reduced number of sequences from the radio unit;
    decompressing the reduced number of sequences by inputting the reduced number of sequences into a trained computational model comprising an alternating sequence of linear and nonlinear functions and thereby obtaining a number of sequences of complex symbols; and
    processing the number of sequences of complex symbols for decoding signals received over an array of antennas of the radio unit.

8. The method according to claim 7, wherein the trained computational model comprises an auto-decoder.

9. The method according to claim 7, wherein the trained computational model comprises a convolutional auto-decoder, a recurrent auto-decoder, a neural Turing machine, a perceptron, or any combination thereof.

10. A radio unit for handling a number of received radio signals over an array of antennas comprised in the radio unit, wherein the radio unit comprising:
    at least one processor; and
    a memory comprising instructions which, when executed by the at least one processor, cause the radio unit to:
        transform the number of received radio signals into a number of sequences of complex symbols;
        filter the number of sequences of complex symbols by inputting the number of sequences of complex symbols into a trained computational model comprising an alternating sequence of linear and nonlinear functions and thereby obtaining a reduced number of sequences; and
        transmit the reduced number of sequences to a baseband unit over a front-haul link.

11. The radio unit according to claim 10, wherein the radio unit is to transform the number of received radio signals by Discrete Fourier Transform DFT over-sample of the number of sequences of complex symbols; and wherein the radio unit is to filter the number of sequences of complex symbols by input of the DFT over-sampled number of sequences into the trained computational model.

12. The radio unit according to claim 11, wherein the radio unit is to DFT over-sample by using a DFT matrix multiplication on the number of sequences of complex symbols.

13. The radio unit according to claim 10, wherein the trained computational model comprises an auto-encoder.

14. The radio unit according to claim 10, wherein the trained computational model comprises a convolutional auto-encoder, a recurrent auto-encoder, a neural Turing machine, a perceptron, or any combination thereof.

15. The radio unit according to claim 10, wherein the radio unit is further to train the computational model at site.

16. A baseband unit for handling sequences from a radio unit received over a front-haul link, wherein the baseband unit comprising:
    at least one processor; and
    a memory comprising instructions which, when executed by the at least one processor, cause the baseband unit to:
        receive a reduced number of sequences from the radio unit;
        decompress the reduced number of sequences by inputting the reduced number of sequences into a trained computational model comprising an alternating sequence of linear and nonlinear functions and thereby obtaining a number of sequences of complex symbols; and
        process the number of sequences of complex symbols for decoding signals received over an array of antennas of the radio unit.

17. The baseband unit according to claim 16, wherein the trained computational model comprises an auto-decoder.

18. The baseband unit according to claim 16, wherein the trained computational model comprises a convolutional auto-decoder, a recurrent auto-decoder, a neural Turing machine, a perceptron, or any combination thereof.

* * * * *